(12) United States Patent
Yokoyama et al.

(10) Patent No.: US 6,967,708 B1
(45) Date of Patent: Nov. 22, 2005

(54) PATTERN TRANSFER DEVICE USING PC PROJECTOR

(75) Inventors: Hiroshi Yokoyama, Ibaraki (JP); Kazumi Haga, Tokyo (JP)

(73) Assignees: National Institute of Advanced Industrial Science and Technology, Tokyo (JP); NanoSystem Solutions, Inc., Tokyo (JP)

( * ) Notice: Subject to any disclaimer, the term of this patent is extended or adjusted under 35 U.S.C. 154(b) by 0 days.

(21) Appl. No.: 10/415,555

(22) PCT Filed: Nov. 10, 2000

(86) PCT No.: PCT/JP00/07929

§ 371 (c)(1),
(2), (4) Date: May 1, 2003

(87) PCT Pub. No.: WO02/39189

PCT Pub. Date: May 16, 2002

(51) Int. Cl.[7] .................. G03B 27/42; G03B 27/52; G03B 27/54
(52) U.S. Cl. .................... 355/53; 355/55; 355/67
(58) Field of Search ................ 355/53, 77, 57, 355/67; 430/5, 22, 30, 311, 296; 250/548

(56) References Cited

U.S. PATENT DOCUMENTS

| | | | |
|---|---|---|---|
| 5,793,473 A * | 8/1998 | Koyama et al. | 355/55 |
| 6,356,343 B1 * | 3/2002 | Shiraishi et al. | 355/77 |
| 6,379,867 B1 * | 4/2002 | Mei et al. | 430/296 |
| 6,563,567 B1 * | 5/2003 | Komatsuda et al. | 355/71 |
| 6,628,390 B1 * | 9/2003 | Johnson | 356/400 |
| 6,818,389 B2 * | 11/2004 | Fritze et al. | 430/394 |

FOREIGN PATENT DOCUMENTS

| | | |
|---|---|---|
| JP | 1-308021 | 12/1989 |
| JP | 2-192710 | 7/1990 |
| JP | 7-183210 | 7/1995 |
| JP | 8-8161 | 1/1996 |

* cited by examiner

*Primary Examiner*—Peter B. Kim
(74) *Attorney, Agent, or Firm*—Crowell & Moring LLP

(57) ABSTRACT

A projection exposure apparatus comprising: a display device having a reflection-type or transmission-type display portion on which a predetermined image to be exposed is displayed; a stage for holding a substrate to be exposed; and a telecentric-type projection lens for projecting the predetermined image displayed on the display portion onto the surface of the substrate held on the stage.

8 Claims, 4 Drawing Sheets

PATTERN TRANSFER DEVICE USING PC PROJECTOR

TECHNICAL FIELD

The present invention relates to a projection exposure apparatus for use in a photolithography process, capable of transferring a desired pattern.

BACKGROUND ART

Mask aligners and steppers (reductive projection exposure apparatus) are known as lithographic projection exposure apparatuses. The former is an apparatus for exposing a reticle mask pattern for a wide area at a time, and is an essential apparatus for fabrication of liquid crystal device, ensuring an accuracy of 0.8 μm or higher on the line-and-space basis. The latter stepper is dedicated to a semiconductor process, which reductively forms an image of a reticle mask pattern corresponding to each device size, ensuring an accuracy of 0.18 to 0.5 μm or around on the line-and-space basis.

Using the former mask aligner for research and development of devices, however, makes it difficult to rapidly repeat trial-and-error experiments since the reticle is very expensive and requires a very long time of period for delivery thereof. There is also known a relatively inexpensive manual-operation-type mask aligner, operation of which however requires a great deal of skill since alignment and so forth must be achieved manually, so that reproducibility in the experimental results tend to vary depending on the level of skill in the operation.

Also the latter stepper is not practical for use in research and development since it suffers not only from the same problems in the reticle fabrication, but also from problems that the apparatus is expensive, that a facility environment around the apparatus needs a very severe control, and that its full-automatic nature makes it difficult to be applied to purposes other than semiconductor process.

It is therefore an object of the present invention to provide a projection exposure apparatus for research and development, which is capable of readily transfer a desired pattern, and moreover featured by its compactness, inexpensiveness and easy operation.

DISCLOSURE OF THE INVENTION

To solve the aforementioned problems, a projection exposure apparatus of the present invention comprises a display device having a reflection-type or transmission-type display portion on which a predetermined image to be exposed is displayed; a stage for holding a substrate to be exposed; and a telecentric-type projection lens for projecting the predetermined image displayed on the display portion onto the surface of the substrate held on the stage.

In the projection exposure apparatus, the projection lens projects a predetermined image displayed on the display portion onto the surface of the substrate held on the stage, so that a desired image can readily be transferred onto the substrate. That is, the display device can typically be composed of a liquid crystal display device, which is capable of readily altering display of the predetermined image in response to electric input signals, and such display device is commercially available at a low cost, which makes it more easier to alter design or specification in the phase of research and development, as compared with the case where a reticle which is very expensive and requires a very long time of period for delivery is used. In addition, use of the projection lens of telecentric type can reduce influence on imaging magnification of transferred image on the substrate even under the presence of a slight alignment error in the direction of the optical axis, and enables pattern transfer with an excellent reproducibility.

In a preferred embodiment of the foregoing apparatus, the projection lens has a zoom optical system for varying magnification of the projection lens, and the zoom optical system has a variable magnification mechanism based on an inner driving system.

Because the projection lens has the zoom optical system for varying magnification of the projection lens, and the zoom optical system has the variable magnification mechanism based on the inner driving system, the apparatus makes it possible not only to transfer a predetermined image displayed on the display portion properly with a desired magnification onto the substrate held on the stage, but also to improve the workability since the working distance does not vary during the variable magnification operation.

In a preferred embodiment of the foregoing apparatus, the apparatus further comprises a stop control mechanism for controlling a size of an aperture stop provided in the projection lens.

Because the apparatus herein further comprises the stop control mechanism for controlling size of the aperture stop, the resolution can be altered depending on control of the stop control mechanism, to relatively smoothen the contour of a projected image projected onto the substrate even if the predetermined image displayed on the display portion has a jagged contour expressed by connected dots of matrix.

In a preferred embodiment of the foregoing apparatus, the apparatus further comprises a control computer for supplying an image data corresponding to the predetermined image to the display device, and switching a dot-matrix-type display status of pixels provided on the display portion into a display status corresponding to the image data.

By using the control computer, the image data supplied to the display device can be corrected or altered in an easy-and-rapid manner, and therefore it is possible to improve operability of the projection exposure apparatus.

In a preferred embodiment of the foregoing apparatus, the display device can preferably be composed of a liquid crystal display device.

BEST MODE FOR CARRYING OUT THE INVENTION

Figure 1:
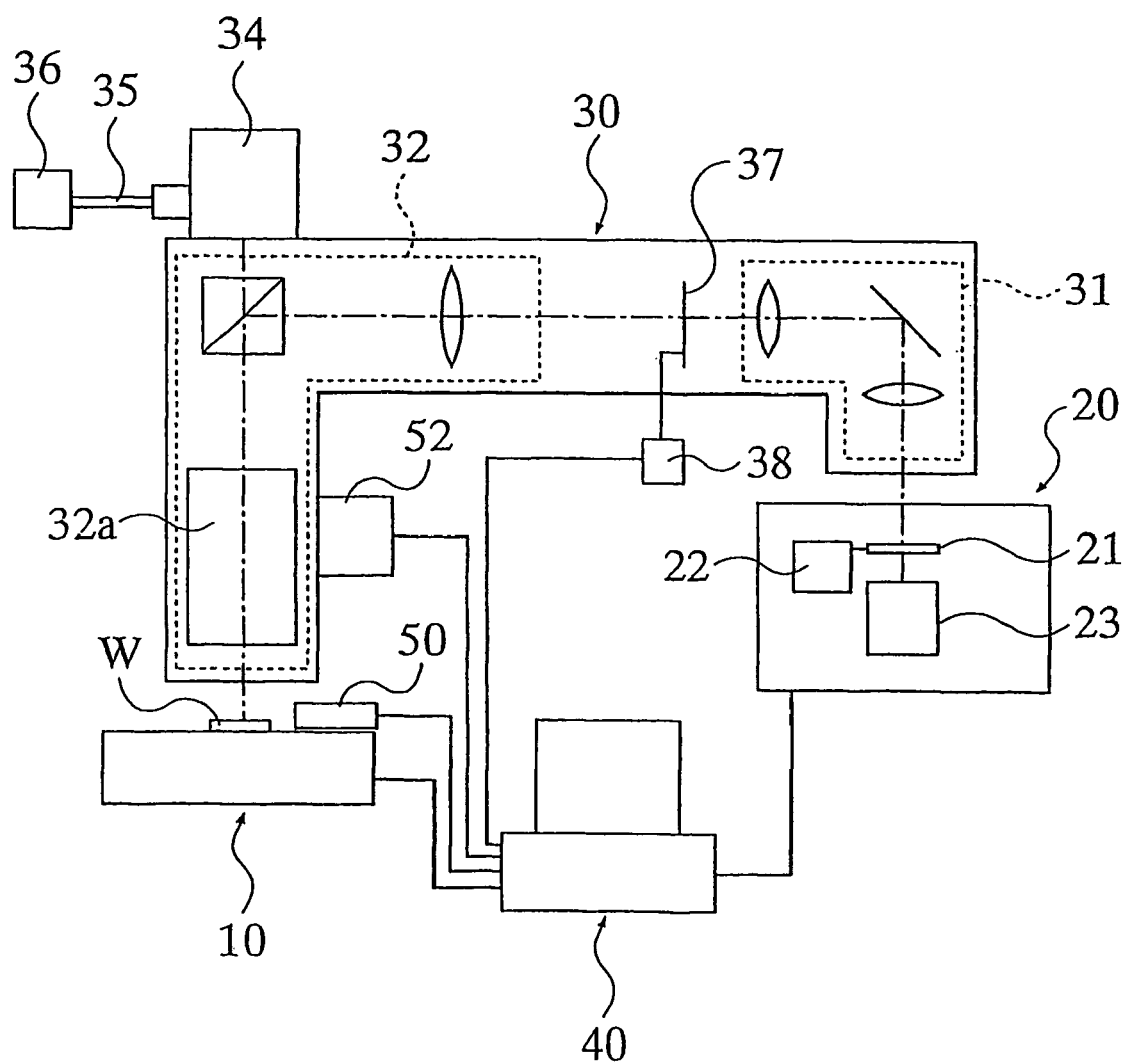
FIG. 1 is a view for explaining a general constitution of the projection exposure apparatus of the embodiment.

FIG. 1 is a schematic view for explaining a constitution of the projection exposure apparatus according to a first embodiment of the present invention.

The projection exposure apparatus comprises a stage 10 for holding a substrate W which is the object to be exposed; a liquid crystal display device 20 in which a transfer pattern to be exposed onto the substrate W is displayed on a liquid crystal panel 21 which is a liquid crystal display portion; a telecentric-type projection lens device 30 for projecting the transfer pattern displayed on the liquid crystal panel 21, onto the surface of the substrate W held on the stage 10; and a computer 40 for regulating and controlling the entire operations of the projection exposure apparatus.

The stage 10 can move the substrate W within the X-Y plane, and also in the direction of the Z-axis. The stage 10 is further designed to be rotatable around the X-axis and Y-axis so as to control a tilt angle of the substrate W. Positions of the substrate W held on the stage 10 in the X-Y plane or in the Z-axis direction, and the tilt angle of the substrate W are controlled by the computer 40 based on measured results output from an alignment unit 50.

The alignment unit 50 can optically detect the position and the tilt of the stage 10 by reading marks formed on the stage 10, or by irradiating an inspection light to the substrate 10, or the like. Use of such alignment unit 50 enables an automatic alignment of the substrate W with respect to the projection lens device 30, to provide a full-automatic projection exposure apparatus.

The liquid crystal display device 20 herein is a commercial liquid crystal projector, and comprises the liquid crystal panel 21 of a transmission-illumination-type which includes pixels having a dot matrix pattern to display a desired transfer pattern; a drive circuit 22 for driving the liquid crystal panel 21 to thereby switch ON/OFF display of the individual pixels; and an exposure light source device 23 for illuminating the liquid crystal panel 21 from the back side. The liquid crystal panel 21 herein serves as a mask for displaying the transfer pattern.

The projection lens device 30 comprises a first imaging system 31 for once imaging the transfer pattern displayed on the liquid crystal panel 21 of the liquid crystal display device 20 to thereby form an intermediate image; a second imaging system 32 for projecting the intermediate image formed by the first imaging system onto the substrate W at a desired magnification; and an observatory optical system 23 for observing an image formed on the substrate W. The second imaging system 32 is a telecentric-type zoom optical system capable of varying magnification of the projection lens device 30 typically in three steps, and has a constitution in which a variable magnification mechanism based on inner drive system and an aperture stop control mechanism are incorporated into to an objective lens 32a. A lens control unit 52 herein controls the magnification of projection of the projection lens device 30 by driving the variable magnification mechanism provided to the objective lens 32a according to instructions from the computer 40. At a position between the first imaging system 31 and second imaging system 32, and whereat the intermediate image of the liquid crystal panel 21 is formed by the first imaging system 31, provided is an electromagnetic shutter 37. The shutter 37 is driven by a shutter drive mechanism 38 and is opened only during light exposure. To an observational optical system 34, an illumination light source device 36 is connected through a fiber 35.

The computer 40 used for control is a personal computer which is shifted from the one attached to a commercial liquid crystal projector, and is capable of controlling operation of the liquid crystal display device 20 so as to display a desired transfer pattern on the liquid crystal panel 21 which serves as a mask. Using a CAD or an image processing software pre-installed on the personal computer allows an easy and rapid alteration of the transfer pattern on the liquid crystal panel 21 and also allows statistical management of a huge volume of data related to the transfer patterns before and after the alteration. The computer 40 is also arranged to control operation of the lens control unit 52 according to display status of the transfer pattern on the liquid crystal panel 21 so as to control the reduced magnification or numerical aperture of the objective lens 32a.

Figure 2:
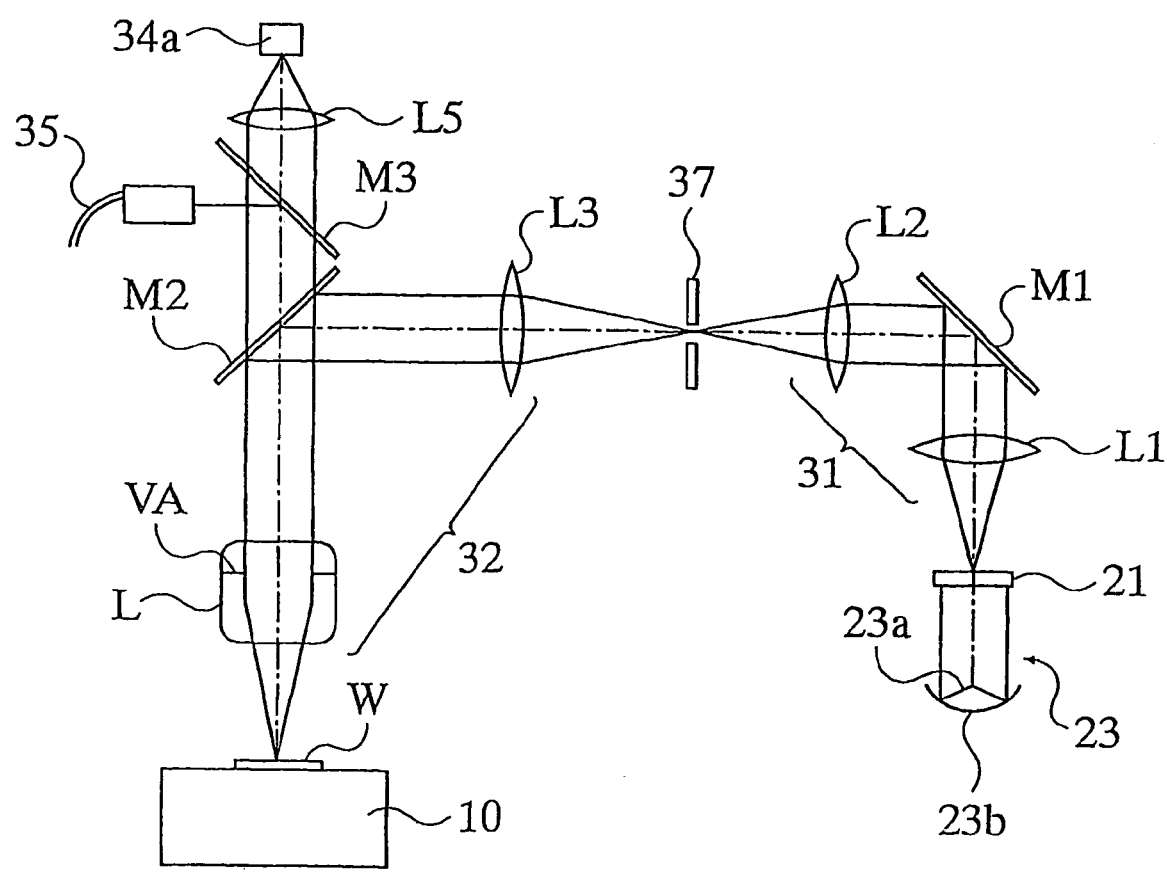
FIG. 2 is a view for explaining an optical system of the apparatus shown in FIG. 1.

FIG. 2 is a view for explaining specific optical elements composing the projection lens device 30, liquid crystal display device 20 and so forth. The exposure light source 23 comprises a lamp 23a for emitting ultraviolet light necessary for the exposure, and a parabolic mirror 23b for converting the exposure light from the lamp 23a into a parallel beam to become incident to the liquid crystal panel 21. The exposure light goes out of the front surface of the liquid crystal panel 21 only through transparent pixels according to the transfer pattern, while the liquid crystal panel is illuminated by the exposure light from the back surface thereof. The exposure light went out through the transparent pixels on the liquid crystal panel 21 is converted into a parallel flux through the lens L1 and deflected by a reflective mirror M1 into the vertical direction, and condensed through a lens L2. At the position where an intermediate image is formed by the lens L2, the electromagnetic shutter 37 is disposed. The exposure light which passed through the shutter 37 is converted into a parallel beam through a lens L3 which is a field lens, and is then reflected by a dichroic mirror M2 incorporated in a beam splitter so as to be deflected in the vertical direction, and is condensed onto the wafer W through the objective lens 32a. As a result, a reduced image of the transfer pattern formed on the liquid crystal panel 21 and the like are projected on the wafer W. This makes it possible to expose a resist layer on the wafer W according to the transfer pattern.

On the other hand, the illumination light supplied through the fiber 35 is reflected by a half mirror M3, passes through the dichroic mirror M2 and illuminates the wafer W through the objective lens 32. The light scattered at the individual points on the wafer W is converted into a parallel beam by the objective lens 32a and passes through the dichroic mirror M2 and the half mirror M3, and is then condensed by an imaging lens L5 to be incident into a CCD camera 34a. This enables observation of the wafer W by using a wavelength different from that of the exposure light.

The first imaging system 31 comprising the lenses L1 and L2 is an optical system of dual-telecentric type, and the second imaging system 32 comprising the lens L3 and objective lens 32a is also of dual-telecentric type. In addition, the wafer-side lens of the objective lens 32a is fixed to thereby keep the working distance always constant. An aperture stop VA provided in the objective lens 32a is automatically controlled according to the magnification of projection, so as to keep an optical brightness (effective F-number) constant.

In one specific exemplary design, the focal length of the lens L1 was about 150 mm, the focal length of the lens L2 was about 70 mm, and the focal length of the lens L3 was about 200 mm. In addition, the focal length of the objective lens 32a was designed to be variable among three steps, that were 2 mm, 20 mm and 100 mm. When the focal length of objective lens 32a is set at 2 mm and the NA thereof is 0.5, a $\frac{1}{100}$ reduced image can be formed. When the focal length of the objective lens 32a is set at 20 mm and the NA thereof is 0.26, a $\frac{1}{10}$ reduced image can be formed. When the focal length of the objective lens 32a is set at 100 mm and the NA thereof is 0.055, a $\frac{1}{2}$ reduced image can be formed.

Figure 3A:
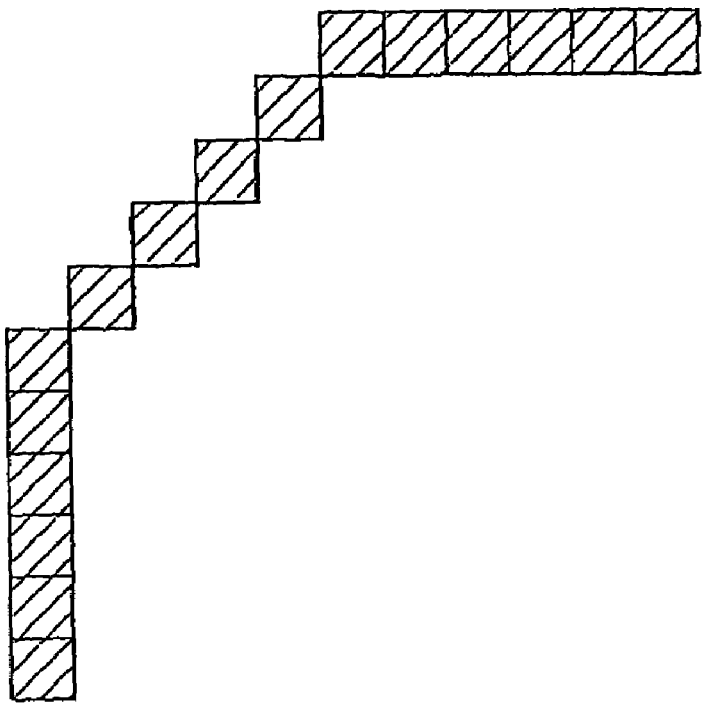
FIG. 3(a) shows a transfer pattern.
Figure 3B:
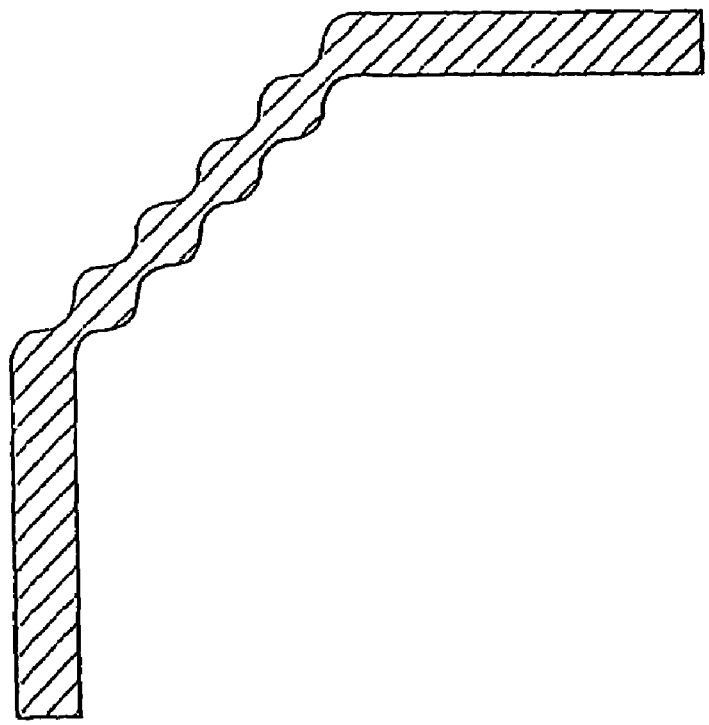
FIG. 3(b) shows a projected image with a resolution controlled.

The aperture stop VA provided in the objective lens 32a can also be used for adjusting the resolution. FIG. 3 is a drawing for explaining relationship between a transfer pattern displayed on the liquid crystal panel 21 and a projected image formed on the substrate W. FIG. 3(a) shows one pattern displayed on the liquid crystal panel 21, and FIG. 3(b) shows a resultant projected pattern. While, as shown in FIG. 3(a), the transfer pattern has a smooth contour for the portion extending along the longitudinal and transverse directions, it has a jagged contour at the obliquely extending portion. The diameter of the aperture stop VA provided in the objective lens 32s is then controlled to thereby intentionally degrade the resolution. FIG. 3(a) is a view for explaining the projected image formed on the substrate W as a result of intentionally degraded resolution. This successfully results in a relatively smooth contour even for such obliquely extending portion on the liquid crystal panel 21. Since the transfer pattern is projected onto the substrate W using the telecentric-type projection lens device 30 in the present embodiment, it is advantageous in that the magnification or the like does not vary even when the aperture stop VA is controlled so as to alter the resolution.

Operation of the projection exposure apparatus shown in FIGS. 1 and 2 will be described below. First, the substrate W is set on the stage 10 while keeping the shutter 37 closed. Next, an appropriate command is entered to the computer 40 to thereby align the substrate W on the stage 10 with regard to the projection lens device 30. Next, a desired transfer pattern is displayed on the liquid crystal panel 21 by using pattern data related to any image stored in the computer, newly-entered pattern data, or the like. Next, the lens control unit 52 is operated using magnification data or stop data, which are preliminarily stored in the computer 40 to thereby set the projection magnification to a necessary value and set the resolution to an appropriate value. Next, the shutter 37 is opened at a proper timing only during an exposure period based on data related to the exposure period stored in the computer 40. By such operation, the transfer pattern on the liquid crystal panel 21 illuminated by the exposure light source device 23 is projected onto the substrate W through the projection lens device 30. The resultant projected image on the substrate W is what is obtained by enlarging or reducing the transfer pattern at a desired magnification, and what is obtained by smoothening the jagged contour by properly degrading the resolution. By exchanging the substrate W for another substrate W, the another substrate W can be exposed by steps similar to the above-described ones. The projected image projected on the substrate W can be altered for each substrate W by only a simple operation of entering an appropriate command to the computer 40.

Second Embodiment

Since the projection exposure apparatus according to the second embodiment is a modified example of the apparatus according to the first embodiment, only portions differed from those in the first embodiment will be explained while omitting the repetitive explanation.

Figure 4:
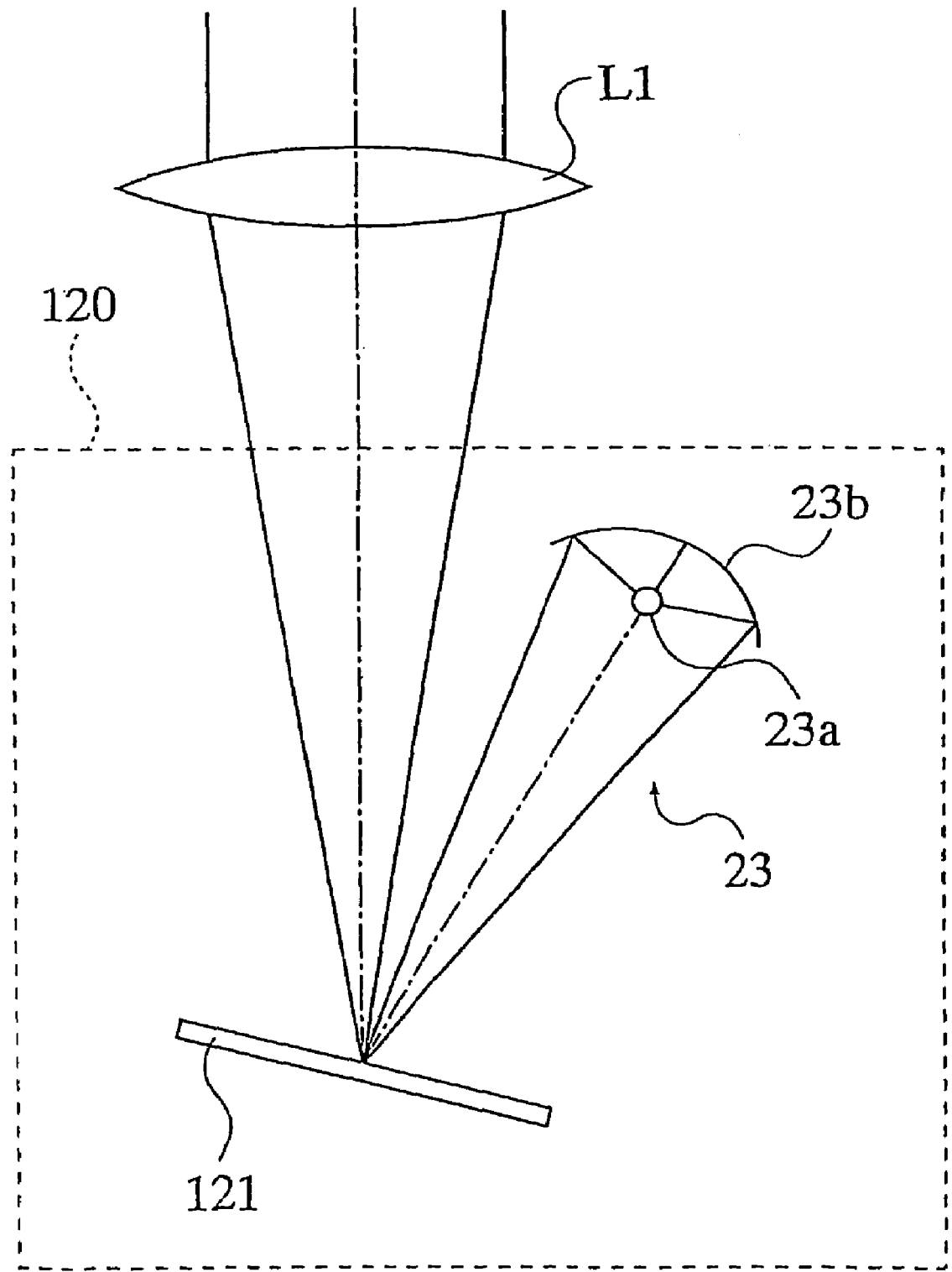
FIG. 4 is a view for explaining a principal portion of the projection exposure apparatus according to the second embodiment.

FIG. 4 is a view for conceptually explaining a constitution of a display device 120 incorporated into the projection exposure apparatus according to the second embodiment. In this case, a display panel 121 having a reflection-type DMD (digital micromirror device) is used, in place of the transmission-illumination-type liquid crystal panel 21 previously shown in FIG. 1, to display a desired transfer pattern thereon.

More specifically, the display panel 121 is illuminated from the front face side by an exposure light coming from a lamp 23a and a parabolic mirror 23b. The display panel 121 comprises a large number of mirrors which are arrayed in a matrix form and are properly adjustable in the angles thereof. The display panel 121 is designed so that each of the mirrors can be switched between a state of reflecting an incident exposure light to the direction of the lens L1 and a state of reflecting the incident exposure light to the direction deflected from the lens L1, with the aid of an unshown drive circuit. That is, when observed from the side of the lens L1, the display panel 121 has a desired transfer pattern displayed thereon. As a result, a reduced image or the like of the transfer pattern formed on the display panel 121 is projected onto the substrate W shown in FIG. 1, similarly to the case in the first embodiment, so that a resist layer on the substrate W can be exposed according to the transfer pattern.

While the present invention has been explained referring to the specific embodiments, the present invention is by no means limited to the aforementioned embodiments. For example, an alignment unit 50 is not an essential one, and the alignment will be possible also through a manual operation using the observational optical system 34 or the like.

It is also allowable to compose the second imaging system 32 with separate zoom lenses individually each having a divisional zoom ratio since a large zoom ratio of the second imaging system 32 tends to increase various aberrations.

For the case where a necessary resolution cannot be obtained typically due to a large reductive magnification, it is still also allowable to set the projection lens device 30 to a fixed magnification and to vary the magnification based on the transfer pattern to be displayed on the liquid crystal panel 21.

INDUSTRIAL APPLICABILITY

As the above-described explanation clearly, according to the projection exposure apparatus of the present invention, a predetermined image displayed on the display portion is projected by the projection lens onto the surface of the substrate held on the stage, so that a desired image can readily be transferred onto the substrate. In addition, use of the telecentric-type projection lens allows pattern transfer with an excellent accuracy and reproducibility.

The projection exposure apparatus of the present invention is therefore capable of readily transferring a desired pattern, featured by its compactness, inexpensiveness and easy operation, and is in particular suitable as a projection exposure apparatus for use in research and development.

What is claimed is:

1. A projection exposure apparatus comprising:
   a display device having a reflection-type or transmission-type display portion on which a predetermined image to be exposed is displayed;
   a stage for holding a substrate to be exposed;
   a telecentric-type projection lens for projecting the predetermined image displayed on said display portion onto the surface of the substrate held on the stage, and
   a stop control mechanism for controlling the size of an aperture stop provided in the projection lens,
   wherein the stop control mechanism controls the aperture stop so that a resolution of a projected image formed by projecting the predetermined image onto the substrate is degraded to smooth a contour of the projected image.

2. The projection exposure apparatus as claimed in claim 1, wherein the projection lens has a zoom optical system for varying magnification of the projection lens, the zoom optical system having a variable magnification mechanism based on an inner driving system.

3. The projection exposure apparatus as claimed in claim 2, further comprising a control computer for supplying an image data corresponding to the predetermined image to the display device, and switching a dot-matrix-type display status of pixels provided on the display portion into a display status corresponding to the image data.

4. The projection exposure apparatus as claimed in claim 3, wherein the computer controls the variable magnification mechanism.

5. The projection exposure apparatus as claimed in claim 1, further comprising a control computer for supplying an image data corresponding to the predetermined image to the display device, and switching a dot-matrix-type display status of pixels provided on the display portion into a display status corresponding to the image data.

6. The projection exposure apparatus as claimed in claim 5, wherein the computer controls the stop control mechanism.

7. The projection exposure apparatus as claimed in claim 1, wherein the projection lens comprises an objective lens and the objective lens comprises the aperture stop.

8. The projection exposure apparatus as claimed in claim 1, further comprising an observational optical system for observing the image projected on the substrate.

\* \* \* \* \*